(12) United States Patent
Hynecek

(10) Patent No.: US 7,737,475 B2
(45) Date of Patent: Jun. 15, 2010

(54) STACKED PIXEL FOR HIGH RESOLUTION CMOS IMAGE SENSOR

(76) Inventor: Jaroslav Hynecek, 905 Pampa Dr., Allen, TX (US) 75013

( * ) Notice: Subject to any disclaimer, the term of this patent is extended or adjusted under 35 U.S.C. 154(b) by 43 days.

(21) Appl. No.: 11/418,212

(22) Filed: May 5, 2006

(65) Prior Publication Data

US 2007/0023801 A1  Feb. 1, 2007

(30) Foreign Application Priority Data

Jul. 27, 2005 (KR) .............. 10-2005-0068469

(51) Int. Cl.
*H01L 31/113* (2006.01)

(52) U.S. Cl. .............. 257/222; 257/225; 257/233; 257/239; 257/E27.133

(58) Field of Classification Search ................ 257/222, 257/225, 233, 239
See application file for complete search history.

(56) References Cited

U.S. PATENT DOCUMENTS

| | | | |
|---|---|---|---|
| 6,194,702 B1 * | 2/2001 | Hook et al. ............ 250/214 A |
| 6,489,643 B1 * | 12/2002 | Lee et al. .............. 257/292 |
| 6,500,692 B1 * | 12/2002 | Rhodes ................. 438/73 |
| 6,504,194 B1 * | 1/2003 | Miida .................. 257/292 |
| 6,521,920 B2 * | 2/2003 | Abe .................... 257/223 |
| 6,566,678 B1 * | 5/2003 | Maeda et al. .......... 257/22 |
| 6,570,201 B2 * | 5/2003 | Shim .................. 257/292 |
| 6,661,459 B1 * | 12/2003 | Koizumi et al. ........ 348/310 |
| 6,677,656 B2 * | 1/2004 | François .............. 257/462 |
| 6,706,550 B2 * | 3/2004 | Lee et al. ............. 438/57 |
| 6,713,796 B1 * | 3/2004 | Fox ................... 257/292 |
| 6,781,169 B2 * | 8/2004 | Roy ................... 257/292 |
| 6,885,047 B2 * | 4/2005 | Shinohara et al. ...... 257/292 |
| 6,894,265 B2 | 5/2005 | Merrill et al. |
| 6,921,934 B2 * | 7/2005 | Patrick ............... 257/292 |
| 7,042,061 B2 * | 5/2006 | Nakamura et al. ...... 257/461 |
| 7,064,406 B2 * | 6/2006 | Mouli ................ 257/446 |
| 7,138,287 B2 * | 11/2006 | Mouli et al. ......... 438/48 |
| 7,154,137 B2 * | 12/2006 | Nozaki ............... 257/292 |
| 7,205,627 B2 * | 4/2007 | Adkisson et al. ....... 257/463 |
| 7,230,289 B2 * | 6/2007 | Komori ............... 257/292 |
| 7,259,412 B2 * | 8/2007 | Yamaguchi et al. ...... 257/291 |
| 2002/0175355 A1 * | 11/2002 | Shim ................. 257/290 |
| 2004/0017846 A1 | 1/2004 | Fernandez-Corbaton et al. |
| 2004/0108502 A1 | 6/2004 | Nakamura et al. |
| 2005/0156264 A1 * | 7/2005 | Sakano et al. ......... 257/432 |

* cited by examiner

*Primary Examiner*—Eugene Lee
(74) *Attorney, Agent, or Firm*—McAndrews, Held & Malloy, Ltd.

(57) ABSTRACT

Provided is a solid-state CMOS image sensor, specifically a CMOS image sensor pixel that has stacked photo-sites, high sensitivity, and low dark current. In an image sensor including an array of pixels, each pixel includes: a standard photo-sensing and charge storage region formed in a first region under a surface portion of a substrate and collecting photo-generated carriers; a second charge storage region formed adjacent to the surface portion of the substrate and separated from the standard photo-sensing and charge storage region; and a potential barrier formed between the first region and a second region underneath the first region and diverting the photo-generated carriers from the second region to the second charge storage region.

24 Claims, 7 Drawing Sheets

STACKED PIXEL FOR HIGH RESOLUTION CMOS IMAGE SENSOR

FIELD OF THE INVENTION

The present invention relates to a solid-state image sensor; and, more particularly to a complementary metal oxide semiconductor (CMOS) image sensor with stacked photo-sites, which result in a compact pixel layout, high sensitivity, and low dark current. The vertical photo-site arrangement obviates the need for utilization of standard light-absorbing color filters to sense colors and increases the sensor pixel density.

DESCRIPTION OF RELATED ARTS

Typical image sensors sense light by converting impinging photons into electrons that are integrated (collected) in sensor pixels. After completion of an integration cycle, collected charge is converted into a voltage, which is supplied to output terminals of the sensor. In a CMOS image sensor, charge-to-voltage conversion is accomplished directly in the pixels themselves and the analog pixel voltage is transferred to the output terminals through various pixel addressing and scanning schemes. The analog signal can also be converted on-chip to a digital equivalent before reaching the chip output.

The pixels have incorporated therein a buffer amplifier, typically a source follower, which drives sense lines that are connected to the pixels by suitable addressing transistors. After the charge-to-voltage conversion is completed and the resulting signal transferred out from the pixels, the pixels are reset in order to be ready for accumulation of new charge. In pixels that are using floating diffusion (FD) as a charge detection node, the reset is accomplished by turning on a reset transistor that momentarily conductively connects the FD node to a voltage reference.

This step removes the collected charge. However, the removal generates kTC-reset noise as is well known in the art. kTC noise has to be removed from the signal by the correlated double sampling (CDS) signal processing technique in order to achieve a desired low noise performance. The typical CMOS sensors that utilize the CDS concept need to have four transistors (4T) in the pixel.

An example of the 4T pixel circuit can be found in U.S. Pat. No. 5,991,184 issued to J. W. Russell et al. By introducing switching pulses into a Vdd bias line, it is possible to eliminate a select transistor from the pixel and achieve CDS operation with only 3T in the pixel as described by Masahiro Kasano in an article entitled "A 2.0 μm Pixel Pitch MOS Image Sensor with an Amorphous Si Film Color Filter," in Digest of Technical Papers ISCC, Vol. 48, February 2005, pp. 348-349. The larger number of transistors in each pixel may become a disadvantage when the pixel size needs to be reduced in order to build low cost and high-resolution image sensors. Standard 3T pixels cannot use the CDS concept for kTC noise suppression and thus, some other methods need to be used to minimize the adverse effects of this noise.

The color sensing in most single chip CMOS and CCD image sensors is accomplished by placing various light absorbing and color transmitting filters on top of the pixels in a predetermined pattern. Thus, the different pixels in a given pixel sub-group or a sub-array become sensitive only to a certain wavelength band of the spectrum. Hence, the pixel sub-groups form single color super pixels. The signal from the "color sensitive" sub-group pixels is then used to construct the color super-pixel signal using various interpolating and color signal-processing methods in an attempt to recover the resolution that has been unavoidably lost in this scheme.

An example of a typical color pixel pattern can be found in U.S. Pat. No. 3,971,065 issued to B. E. Bayer. Another example of the color filter arrangement can be found in the article by Masahiro Kasano already mentioned above. All these approaches to the color sensing may have a principal disadvantage of sacrificing the resolution as mentioned above and sacrificing sensitivity by absorbing light in color filters.

FIG. 1 is a cross-sectional view illustrating a standard photo-site of a typical 4T pixel and an associated pixel circuit. Particularly, a pinned photodiode light-sensing element and a simplified diagram of the associated pixel circuit are illustrated in FIG. 1. A p-type silicon substrate 101 has a shallow trench isolation (STI) region 102, obtained by forming a trench through etching the substrate 101 to a certain depth and filling the trench with a silicon dioxide 103 layer. The silicon dioxide layer 103 also covers the remaining surface of the pixel. A shallow p+-type doped region 104 passivates the walls and the bottom of the STI region 102 as well as the surface of the pixel. A photo-generated charge is collected in the n-type doped region 105 of the pinned photodiode. When a charge integration cycle is completed, the charge from the STI photodiode region (i.e., the n-type doped region 105) is transferred to the floating diffusion (FD) 106 by turning a gate 107 momentarily on. The FD 106 is reset by a first transistor 118 to a suitable potential (i.e., Vdd), and the FD potential changes are sensed by a second transistor 114. A capacitor Cs 119, connected between a Vdd node 117 and a FD node 113, is used to adjust a conversion gain of the pixel. The pixel is addressed via a select transistor 115. Control signals are supplied to the pixel via a transfer gate bus Tx 112, a reset gate bus Rx 120 and an address gate bus Sx 121. The output from the pixel is supplied to a pixel column bus 116. When photons 122 impinge on the pixel, the photons penetrate into the silicon bulk depending on their wavelengths and create electron-hole pairs. Electrons are generated both in a depleted region 109 and in an undepleted region of the substrate 101. The electrons 110 generated in the undepleted region of the substrate 101 then diffuse to the edge of a depletion region 109 where they are quickly swept into a potential well located in the n-type doped region 105. The electrons generated in the neutral undepleted region can also diffuse laterally and contribute to cross-talk between the pixels. For this reason, the depletion region is formed with a certain depth Xd 111, so that the above mentioned unwanted phenomenon could be minimized.

While functioning well, this pixel has no ability to separate charge according to the depth of charge generation and thus according to the wavelength of the photons that have created the charge. As a result, it is necessary to place color filters on top of the pixels to absorb certain portions of the spectrum in order to create the color sensing ability. The absorption of light causes loss of sensitivity, which is an unwanted side effect of this method of color sensing.

One solution to this limitation has been found and is already pursued by several companies, for example, by Foveon as can be learned in U.S. Pat. No. 6,894,265 issued to R. B. Merrill et al. In this approach, three photo-diodes are placed on top of each other inside the silicon bulk and photo-generated carriers are collected at different depths depending on a wavelength of impinging light. A voltage signal is then obtained by connecting these buried photodiodes to circuits located on top of the silicon surface, and charge is sensed, processed, and reset via a typical scheme. One advantage of this approach is that no resolution is sacrificed by placing the color filter covered pixels side by side and no photons need to be absorbed in the color filters. However, it may not be easy to form the photodiodes that are buried deeply in the silicon bulk. Also, it may be difficult to sense charge collected in the buried photodiodes by circuits located on top of the silicon without adding noise.

SUMMARY OF THE INVENTION

It is an object of the present invention to provide a CMOS image sensor with stacked photo-sites, which sense color by vertically separating photo-generated carriers, so that the CMOS image sensor has an advantage of providing two or more color-coded signals without using conventional light absorbing color filters. Placing suitable potential barriers under a typical pinned photodiode structure achieves this goal and other objects of the invention.

In accordance with an aspect of the present invention, there is provided an image sensor including an array of pixels, each pixel including: a standard photo-sensing and charge storage region formed in a first region under a surface portion of a substrate and collecting photo-generated carriers; a second charge storage region formed adjacent to the surface portion of the substrate and separated from the standard photo-sensing and charge storage region; and a potential barrier formed between the first region and a second region underneath the first region and diverting the photo-generated carriers from the second region to the second charge storage region.

In accordance with another aspect of the present invention, there is provided an image sensor including a pixel array, wherein: the pixel array includes a group of pixels with first color filters and a group of pixels with second color filters, which are arranged in the form of a checkerboard pattern; and the pixels with the first color filters have standard photo-sites and the pixels with the second color filters have stacked photo-sites.

The above described exemplary embodiments of the present invention address usual difficulties and provide a simpler and more practical solution for color sensing with less resolution loss than in the typical approach and with minimum loss of light sensitivity. For instance, U.S. Pat. No. 6,894,265 issued to Richard B. Merrill et al. teaches one typical approach of forming the buried photodiode and collecting and storing charge in the deep silicon bulk. On the contrary to the typical approach, a special potential barrier is placed under the standard pinned photodiode, and thus, it is possible do divert the photo-generated carriers from the deep bulk and direct the photo-generated carriers to flow in a narrow region to the surface of the silicon substrate where the photo-generated carriers can be easily collected and stored for readout.

The carriers from the bulk can thus be conveniently stored in a suitable structure next to the carriers generated and stored in the standard photodiode near the silicon substrate surface. It is thus not necessary to form buried photodiodes and collect and store charge deep in the bulk of the silicon, which is often difficult to access, read, and reset. It is also possible to place the special potential barrier in different depths in different pixels and thus make the pixels sensitive to different light spectral regions. Each pixel can thus provide two or more differently coded color signals instead of one. The resolution is not sacrificed as much as in the typical approach and the light sensitivity is also not sacrificed, since no color absorbing filters or not as many color absorbing filters are used. Storing all the photo-generated charge close to the silicon surface makes possible to share some of the low noise readout and reset circuitry that is located there and thus achieve high performance with very small pixel sizes. This approach is thus much simpler and easier to implement in the current CMOS technology with high yield.

BRIEF DESCRIPTION OF THE DRAWINGS

The above and other objects and features of the present invention will become better understood with respect to the following description of the exemplary embodiments given in conjunction with the accompanying drawings, in which.

DETAILED DESCRIPTION OF THE INVENTION

Exemplary embodiments of the present invention will be described in detail with reference to the accompanying drawings.

Figure 1:
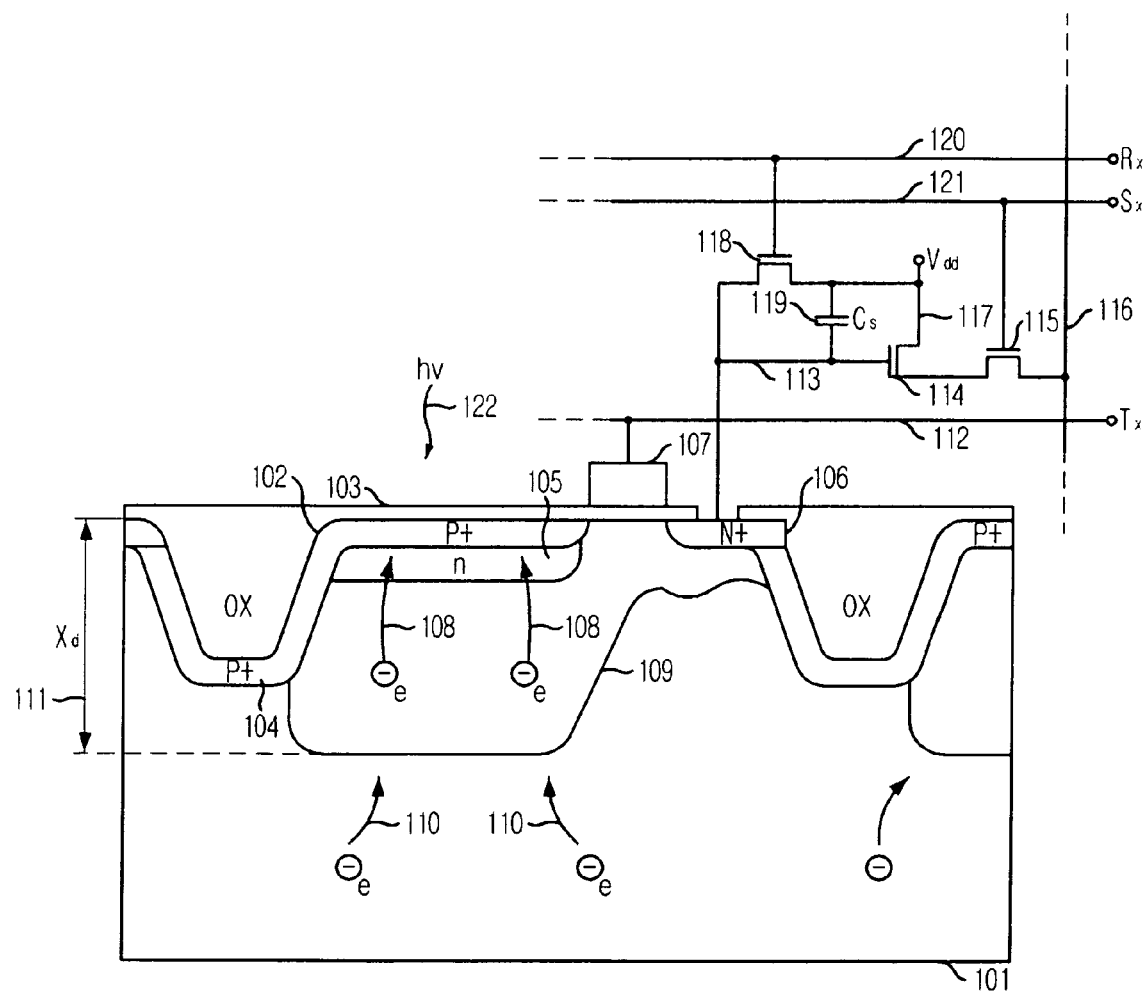
FIG. 1 is a simplified cross-sectional view illustrating a standard pinned photodiode photo-site typically used in a 4T CMOS image sensor pixel and associated pixel circuits.
Figure 2:
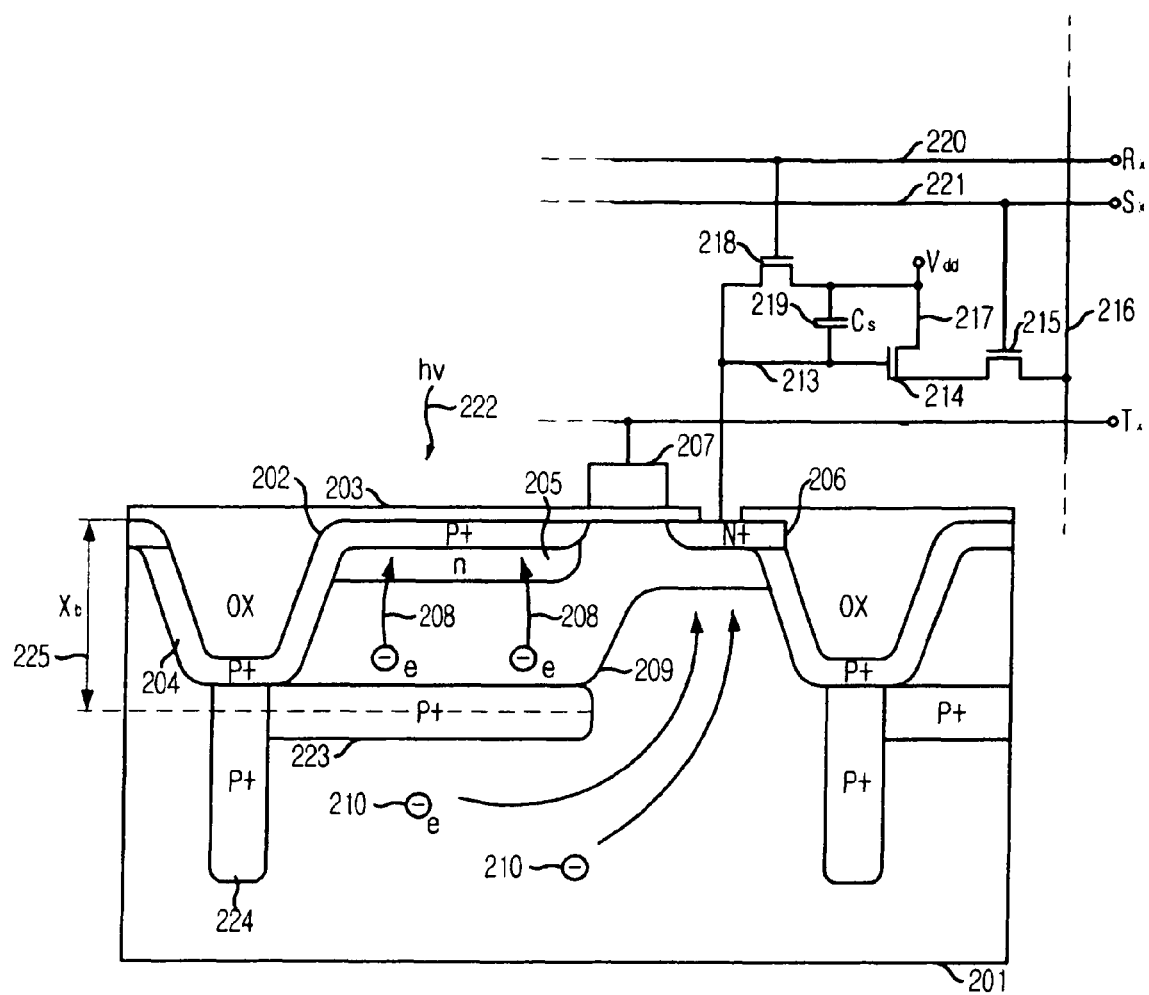
FIG. 2 is a simplified cross-sectional view illustrating a photo-site of associated circuits having a pinned photodiode with an underlying potential barrier in accordance with a first embodiment of the present invention.

FIG. 2 is a simplified cross-sectional view illustrating a pixel with a stacked photo-site and a potential barrier and readout circuits associated with the pixel in accordance with a first embodiment of the present invention.

According to the first embodiment of the present invention, the pixel has an ability to separate charge according to the depth of charge generation and thus sense color. A substrate 201 has a shallow STI region 202, obtained by forming a trench through etching the substrate 201 to a certain depth and filling the trench with a silicon dioxide layer 203. The silicon dioxide layer 203 also covers the entire surface of the pixel. Herein, the substrate 201 is a p-type silicon substrate. A shallow p+-type doped region 204 passivates the walls and the bottom of the STI region 202 as well as the surface of the pixel to minimize a dark current generation. However, in this pixel, a p+-type doped barrier 223 is placed into the pixel at a depth Xb 225. This p+-type doped barrier 223 separates the pixel into two distinct regions. A photo-generated charge 208 is generated within the depth Xb 225, which is typically depleted and, the photo-generated charge 208 is collected and stored in an n-type doped region 205 of a pinned photodiode. Charge 210 generated below the p+-type doped barrier 223 in an undepleted region of the substrate 201 diffuses around the p+-type doped barrier 223 into the edge of a depletion region 209 and is collected and stored in a FD 206.

Since the depletion region is made shallower than the depletion region of the typical pixel, it is necessary to add a charge cross-talk barrier 224 into the above structure to minimize the lateral charge diffusion and thus the pixel cross-talk. As for another approach of reducing the cross-talk, a method of making the STI isolation trench deeper is well known to those skilled in the art and thus, will not be discussed here any further. The pixel according to the first embodiment has an ability to detect and separately store charge generated at different depths according to the wavelength of light generating the charge and thus inherently sense color without necessity of light absorbing filters on top of the pixel. A circuit for processing signals from this pixel is substantially identical to the circuits typically known in the art. A first transistor 218 resets a node 213 after a second transistor 214 senses an electric potential of the FD node. A third transistor 215 is a select transistor that connects a pixel signal to a column sense line 216. The charge, which corresponds to light with longer wavelengths, is collected on the FD 206. A transfer gate Tx 207 is briefly pulsed to transfer charge collected in a pinned photodiode region to the FD 206. This charge corresponds to light with shorter wavelengths. The remaining control signals are supplied to the pixel via a reset gate bus Rx 220 and an address gate bus Sx 221. A conversion gain of this pixel is adjusted by selecting the suitable value for a capacitor Cs 219 that is connected between the node 213 and another node Vdd 217.

When photons 222 impinge on the pixel, they penetrate into the silicon bulk depending on the wavelengths of the photons 222 and create the corresponding electron-hole pairs at the corresponding depths. The pixel according to the first embodiment of the present invention has an ability to sense charge according to the depth of charge generation and thus sense color. As being made clear in the above detailed description, this effect is accomplished without the necessity of forming an additional n-type bulk charge storage region under the pinned photodiode. Only a potential barrier formed by the p+-type doped layer, which does not store charge is added to the pixel. The charge generated below this potential barrier is diverted away from the pinned photodiode and flows into another storage region located at the surface of the substrate. Multiple storage regions can also be formed at the silicon surface. Such an exemplary arrangement will be described with reference to FIG. 3 hereinafter.

Figure 3:
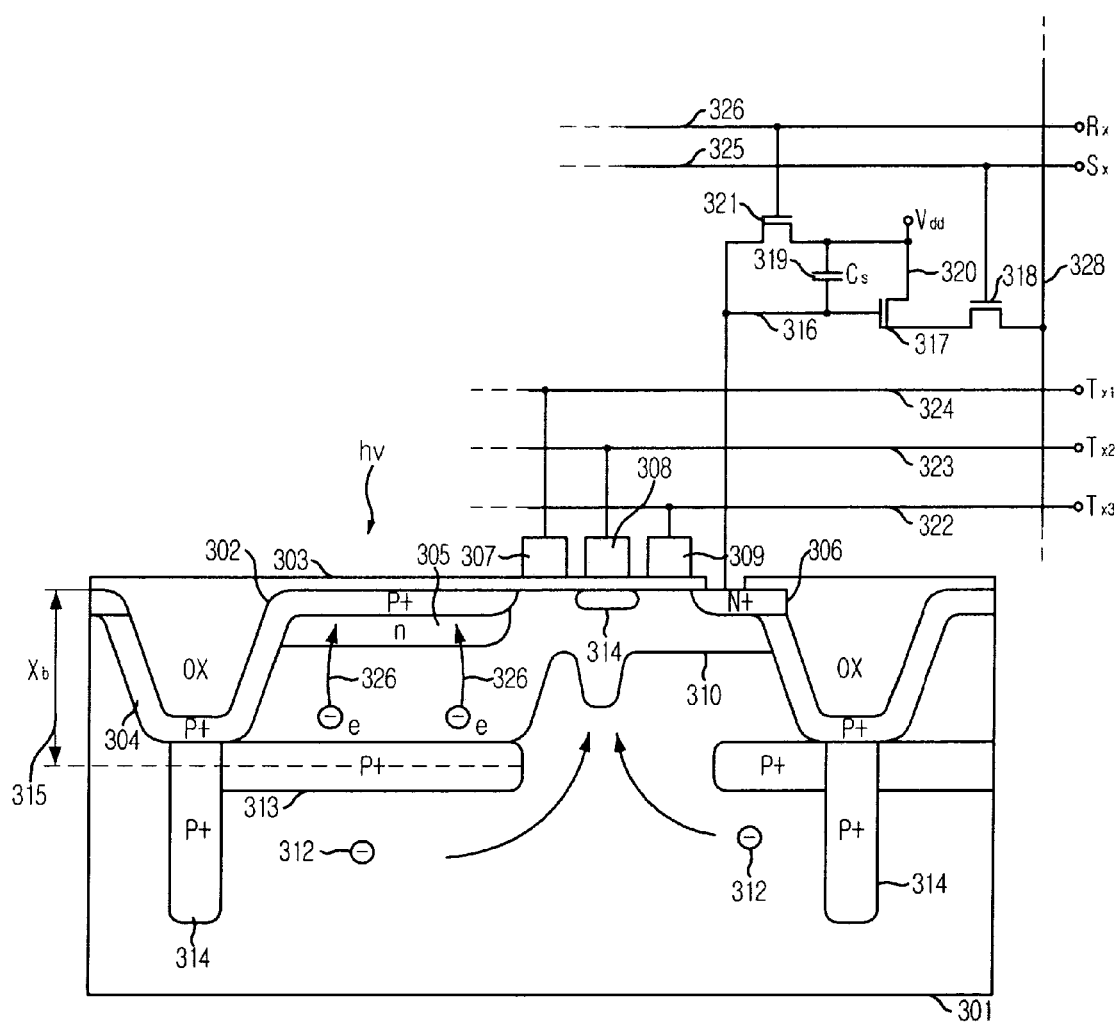
FIG. 3 is a simplified cross-sectional view illustrating associated circuits having a pinned photodiode with an underlying potential barrier in accordance with a second embodiment of the present invention.

FIG. 3 illustrates a cross-sectional view of an improved pinned photodiode and a simplified schematic diagram of an associated pixel circuits in accordance with a second embodiment of the present invention. The pixel has an ability to separate charge according to the depth of charge generation and thus sense color. A substrate 301 has a shallow STI region 302, obtained by forming a trench through etching the substrate 301 to a certain depth and filling the trench with a silicon dioxide layer 303. The substrate 301 may be a p-type silicon substrate. The silicon dioxide layer 303 also covers the entire surface of the pixel as in the typical pixel structure. A shallow p+-type doped region 304 passivates the walls and the bottom of the STI region 302 as well as the surface of the pixel to minimize the dark current generation. In this pixel, same as in the first embodiment, a p+-type doped barrier 313 is placed at a depth Xb 315 into the pixel together with a cross-talk barrier 314. The P+-type doped barrier 313 separates the pixel into two distinct regions as described in the first embodiment, and photo-generated charge 326 generated within the depth Xb 315 (typically depleted) is collected and stored in an n-type doped region 305 of a pinned photodiode. Charge 312 generated below the p+-type doped barrier 313 in an undepleted region of the substrate 301 diffuses around the p+-type doped barrier 313 into the edge of a depletion region 310 and is collected and stored in a special potential well 314 under a gate 308 instead in a FD 306. The potential well 311, formed by applying a suitable bias to gates 307, 308, and 309, stores the charge in a CCD fashion so that the charge can be transferred to the FD 306 and read using the CDS concept, same as the charge stored in the pinned photodiode. The CDS readout concept is well known to those skilled in the art and is used to remove kTC noise from the signal generated by the destructive charge readout of the FD 306. The rest of the circuit is the same as in the first embodiment with a source follower transistor (SF) 317 sensing a FD node potential, a select transistor 318 connecting an output to a column bus 328, and a reset transistor 321 resetting the FD 306. The pixel also uses a capacitance Cs 319, which is connected between a node 316 and another node Vdd 320, to adjust a conversion gain of the pixel. The control signals are supplied to the pixel by a reset gate bus Rx 326, a select gate bus Sx 325, and three transfer gate buses Tx1 324, Tx2 323, and Tx3 322.

Another method for suppressing kTC noise can be used with the above-described pixels, such as a parametric reset, an active reset, or a negative feedback reset that can be introduced into the node 316. All these techniques are well known to those skilled in the art and will not be discussed here any further.

It is also clear to those skilled in the art that the depth Xb 315 of the P+-type doped barrier 313 can be changed from pixel to pixel and thus, different pixels can have different color sensitivity. For example, when ion implantation of boron with energy of approximately 150 keV is used to form the p+-type doped barrier 313, severing as a potential barrier, the p+-type doped barrier 313 is formed at a depth of approximately 0.4 um. This depth is suitable for the separation of charge created by blue light from charge created by yellow light. On the other hand, when the boron with ion implant energy of approximately 1.2 MeV is used, the p+-type doped barrier 313 is formed at a depth of approximately 2.0 um. This depth is suitable for separation of charge created by cyan light from charge created by red light. Hence, it is possible to extract red (R), green (G) and blue (B) color signals or cyan (Cy), magenta (Mg) and yellow (Ye) color signals from these two pixels by suitable signal processing circuits. It is thus not necessary to use the light absorbing filters placed on top of the pixel and sacrifice the sensor light sensitivity. The processing of color coded pixels and extraction of the R, G, B or other combinations of color signals from such pixels is a well developed technique in the art, and therefore will not be discussed here any further.

There are many other combinations of the pinned photodiode arrangements and charge storage wells that can be used with the pixel according to the second embodiment of the present invention. For the simplicity of description one such possibility and another embodiment of the present invention is shown only in a simplified circuit diagram form in FIG. 4.

Figure 4:
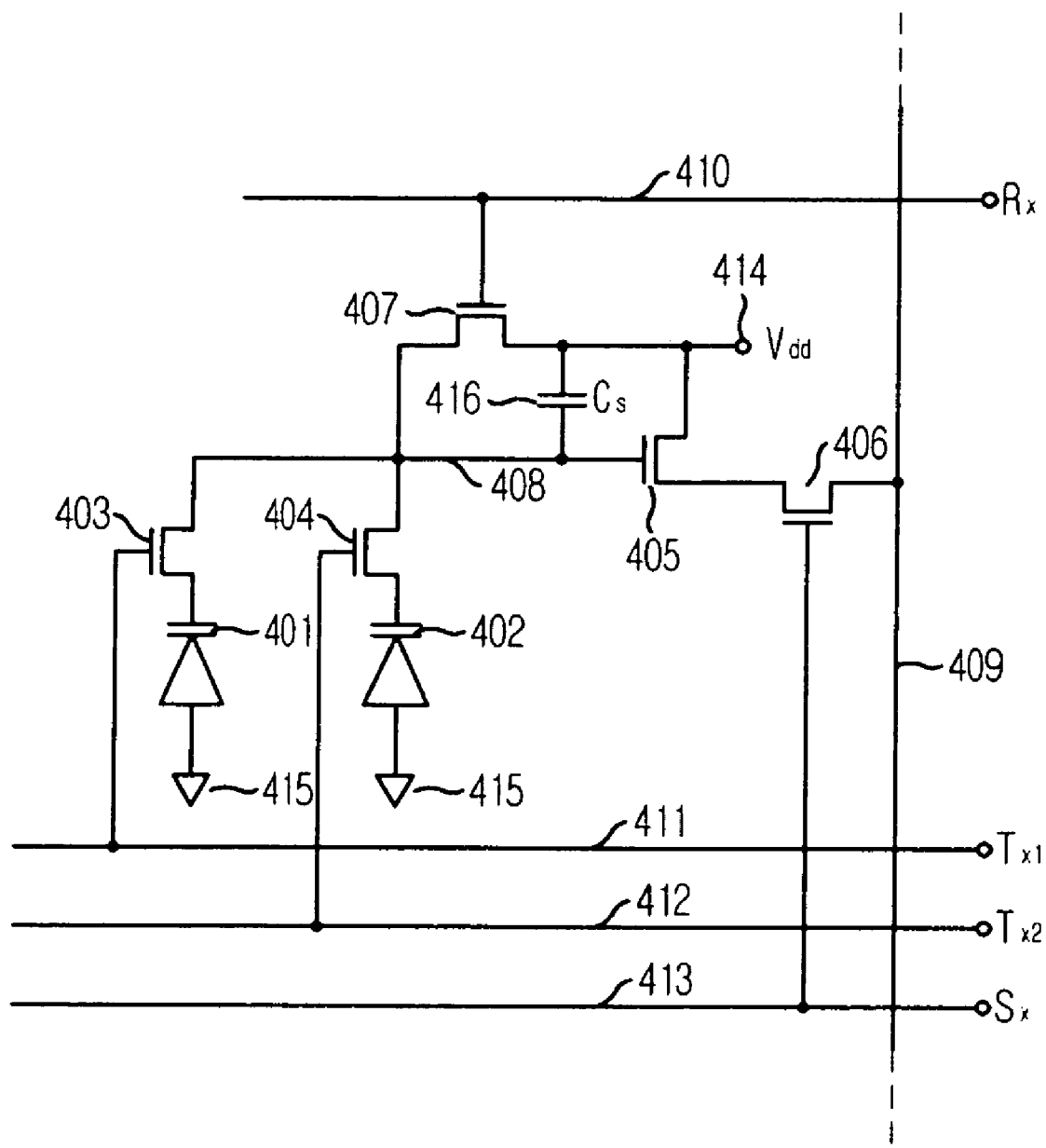
FIG. 4 is a diagram illustrating circuits where the charge packets can be read independently using a CDS readout method in accordance with a third embodiment of the present invention.

FIG. 4 is a simplified circuit diagram illustrating a stacked pixel where charge from a shallow depleted region is stored in a pinned photodiode 401 and charge from a deep undepleted region is directed to another pinned photodiode 402. The pinned photodiodes 401 and 402 interface with a common FD charge detection node 408 via respective charge transfer gates 403 and 404. The rest of the circuit is the same as in the first and second embodiments where transistors 405, 406 and 407 are a SF transistor 405, an address transistor and a reset transistor, respectively. Control signals are supplied to the pixel via a reset gate bus Rx 410, an address gate bus Sx 413, and two transfer gate buses Tx1 411 and Tx2 412. The pixel Vdd bias is supplied to a terminal 414 and the ground reference is a terminal 415. The pixel has a capacitor Cs 416 to adjust a conversion gain of the pixel.

Figure 5:
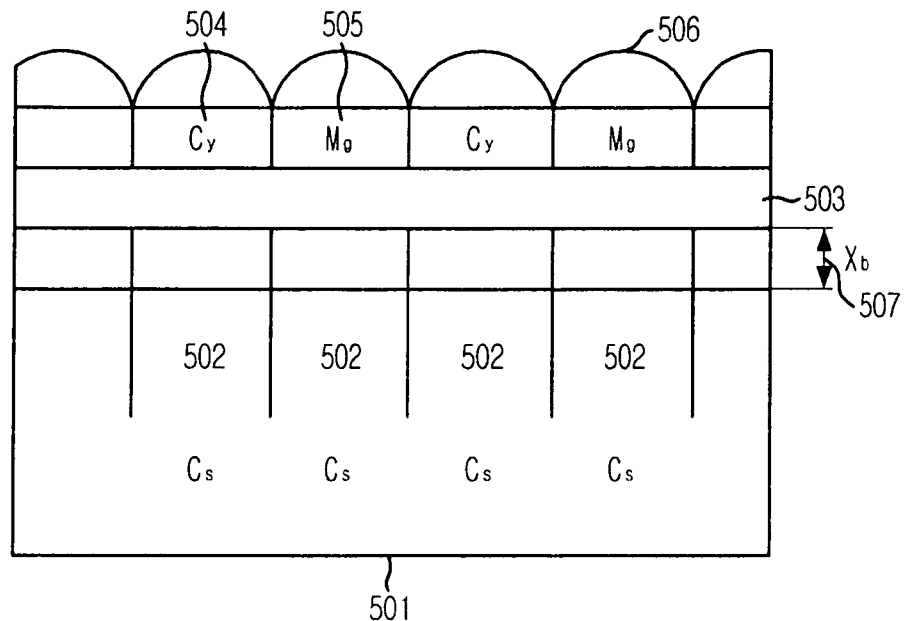
FIG. 5 is a diagram illustrating pixels with stacked photo-sites, in which cyan and magenta color filters with micro-lenses are placed on top of the pixels in accordance with a fourth embodiment of the present invention.

FIG. 5 is a simplified cross sectional view illustrating a stacked pixel array in which all pixels have substantially an identical construction. A substrate 501 contains an array of substantially identical stacked pixels 502 incorporated with potential barriers at a depth Xb 507 and cross-talk barriers. The substrate 501 has an oxide layer 503 formed on top of the surface of the substrate 501. Cyan and magenta filters 504 and 505 are formed on top of the oxide layer 503. Micro-lenses 506 are also formed on top of the cyan and magenta color filters 504 and 505 to improve pixel aperture efficiency. Since each pixel can deliver two color-coded signals, it is easily seen that the pixels with the cyan filters 504 supply blue and green color information while the pixels with the magenta filters 505 supply blue and red color information. The pixels in the present embodiment have substantially identical values for capacitances Cs and thus, substantially an identical conversion gain, and saturate at a nearly identical output level when white light impinges on a sensor. Since only the complementary color filters are always used with the stacked pixels, it is clear to those skilled in the art that the sensitivity of such sensors has improved two times in comparison with the standard Bayer sensor configuration. The resolution is also improved two times in comparison with the standard case, since the total pixel density is twice the standard case.

Figure 6:
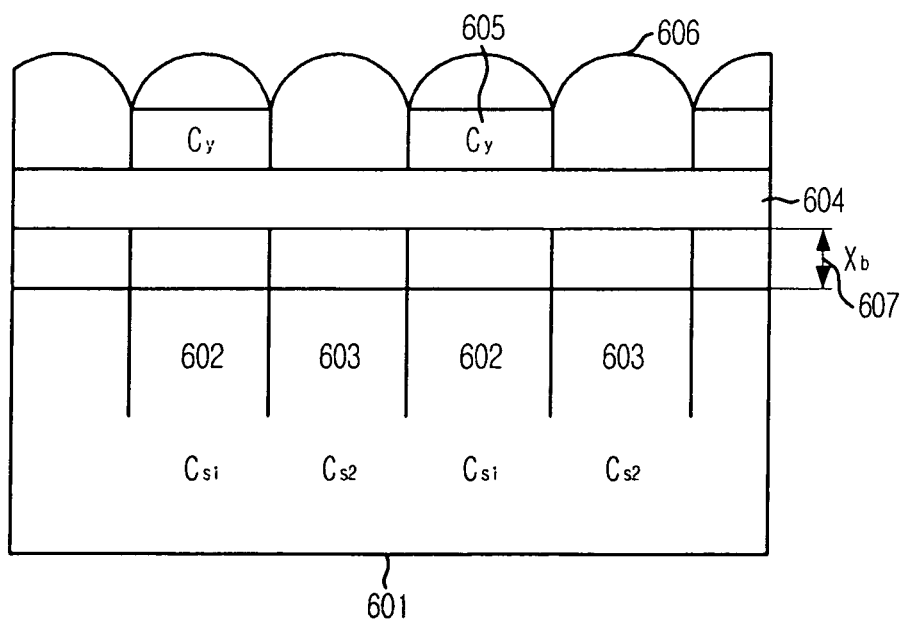
FIG. 6 is a diagram illustrating pixels with stacked photo-sites, in which cyan color filters with micro-lenses are placed on top of a group of the pixels next to a group of the pixels without color filters and the two groups of the pixels have different conversion gains depending on a value of a pixel capacitor in accordance with a fifth embodiment of the present invention.

FIG. 6 is a simplified cross-sectional view illustrating a stacked pixel array in which neighboring pixels have different conversion gains. A substrate 601 contains an array of stacked pixels 602 and 603 incorporated with potential barriers at a depth Xb 607 with cross-talk barriers, but with different capacitors Cs1 and Cs2 and thus different conversion gains. An oxide layer 604 is formed on top of the surface of the substrate 601 and only cyan color filters 605 are formed on top of the oxide layer 604. Micro-lenses 606 are also formed on top of a group of the pixels 602 with the color filters 605 as well as on another group of the pixels 603 with no color filters. It is clear to those skilled in the art that the group of the pixels 602 with the cyan filters 605 supplies the blue and green color information while the other group of the pixels 603 with no color filter supplies the blue and yellow color information. The sensitivity can be further improved and different conversion factor values can be used to balance the signal levels in each pixel to make sure that the pixel output saturates at nearly the same level for each pixel when white illumination impinges on a sensor. Interference color filters can be used in this embodiment instead of pigment type color filters, which significantly reduce the height of the pixel structure above the photodiode surface and thus improves the pixel performance for wide light incidence angles.

Figure 7:
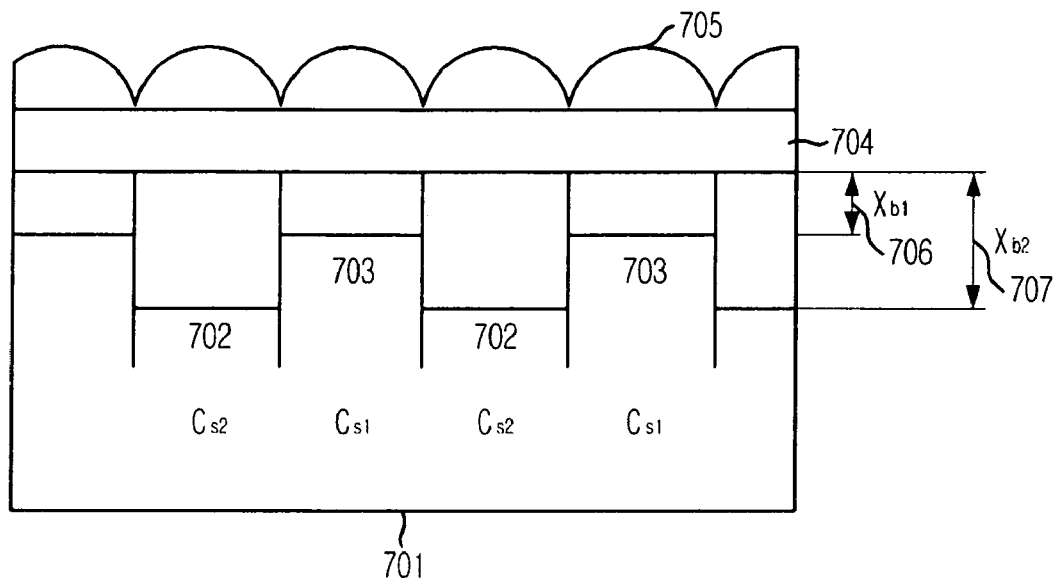
FIG. 7 is a diagram illustrating pixels, in which micro-lenses are placed on top of the pixels without absorbing color filters and the different pixels have different depths of a potential barrier Xb and different values of conversion gain in accordance with a sixth embodiment of the present invention.

FIG. 7 is a simplified cross-sectional view illustrating a stacked pixel array in which neighboring pixels have different conversion gains and different barrier depths in the neighboring pixels. A substrate 701 contains an array of stacked pixels 702 and 703 incorporated with potential barriers at respective depths Xb2 707 and Xb1 706 and also cross-talk barriers. Different capacitors Cs1 and Cs2 provide different conversion gains for the pixels 702 and 703. The substrate 701 includes an oxide layer 704 formed on top of the surface of the substrate 701 and has no color filters. Micro-lenses 705 are deposited on top of the oxide layer 704 to improve the pixel aperture efficiency. It is again clear to those skilled in the art that a group of the pixels 703 with the shallow barriers formed at the depth Xb1 706 supply the blue and yellow color information while a group of the pixels 702 with the deep barriers formed at the depth Xb2 707 supply cyan and red color information. The pixel sensitivity can be improved and different conversion gain factor values can be used to balance the signal levels in each pixel to make sure that the pixel output saturates at nearly the same level for each pixel when white illumination impinges on a sensor. The complete elimination of the color filters reduces the height of the pixel structure above the photodiode surface to its minimum and thus, achieves a maximum pixel performance for wide light incidence angles with maximum light sensitivity.

Figure 8:
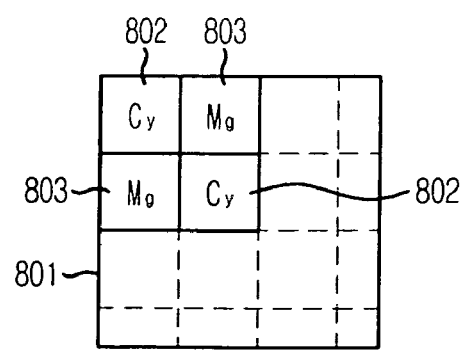
FIG. 8 is a diagram illustrating a color filter arrangement in a two-dimensional pixel array for magenta and cyan on top of the pixels to achieve an improved and more compact color sensing in accordance with a seventh embodiment of the present invention.
Figure 9:
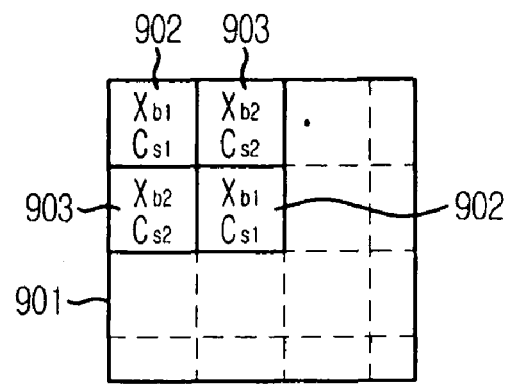
FIG. 9 is a diagram illustrating a pixel arrangement in a two-dimensional pixel array without any color filters on top of the pixels to achieve an improved and more compact color sensing in accordance with an eighth embodiment of the present invention.

A top view of one possible filter and pixel arrangement is shown in FIG. 8 for a sensor with cyan and magenta color filters and in FIG. 9 for a sensor without any color filters. FIG. 8 illustrates a corner of a pixel array 801 with a block of four pixels arranged in a certain pattern. For instance, the four pixels can be arranged in a checkerboard pattern. Pixels 802 have cyan color filters Cy on top, and other pixels 803 have magenta color filters Mg on top. All of the pixels 802 and 803 have substantially an identical barrier depth Xb incorporated therein and an identical value for a capacitor Cs. FIG. 9 illustrates a corner of a pixel array 901 with a block of four pixels arranged in a certain pattern. For instance, the four pixels can be arranged in a checkerboard pattern. Pixels 902 have shallow barriers formed at a depth Xb1 incorporated therein with a capacitor Cs1, and other pixels 903 have deep barriers formed at another depth Xb2 incorporated therein with another capacitor Cs2. It is also possible to combine the standard shared circuit color pixel with the stacked pixel concept in a manner that one photo-site of the shared circuit pixel is a stacked photo-site and the other is a standard photo-site. This arrangement is shown schematically in FIG. 10.

Figure 10:
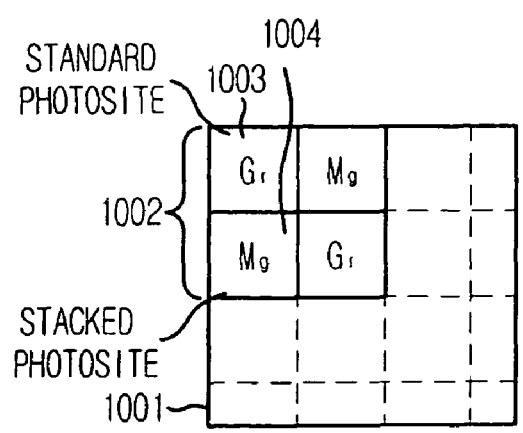
FIG. 10 is a diagram illustrating an arrangement of two pixels respectively with a standard photo-site and a stacked photo-site in accordance with a ninth embodiment of the present invention.

FIG. 10 is a diagram illustrating a corner of a pixel array 1001 with a block of pixel pairs 1002 with shared readout and reset circuits as shown in FIG. 4. The shared pixel pair 1002, however, includes a stacked photo-site 1004 and a standard photo-site 1003. The stacked photo-site 1004 has a magenta color filter Mg formed on top while the standard photo-site 1003 has a green color filter Gr formed on top. Other filter arrangements are also possible where the standard photo-site has a red filter formed on top and the stacked photo-site has a cyan filter formed on top. All these combinations improve the sensitivity as well as the resolution in comparison with the typical standard approach.

Other pixel arrangements with more than two barrier depths and more than two values of the capacitance Cs are, of course, possible as is clear to those skilled in the art.

On the basis of the exemplary embodiments of the present invention, the pixel with stacked photo-sites has an ability to detect two color-coded signals without using any light absorbing color filters on top of the pixel. The image sensors constructed using the stacked pixels have higher pixel densities, higher resolution and higher sensitivity.

The present patent application contains subject matter related to the Korean patent application No. KR 2005-

0068469, filed in the Korean Patent Office on Jul. 27, 2005, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. An image sensor including an array of pixels, each pixel comprising:
    a standard photo-sensing and charge storage region formed in a depleted region under a surface portion of a substrate, wherein the depleted region is configured to collect first photo-generated carriers;
    a second charge storage region formed at the surface portion of the substrate and separated from the standard photo-sensing and charge storage region; and
    a potential barrier separating the depleted region from an undepleted region underneath the depleted region, wherein the undepleted region is configured to collect second photo-generated carriers, and wherein the potential barrier is configured to divert the second photo-generated carriers from the undepleted region to the second charge storage region.

2. The image sensor of claim 1, wherein the second charge storage region is a floating diffusion.

3. The image sensor of claim 1, wherein the second charge storage region is a potential well formed underneath a gate in the surface portion of the substrate.

4. The image sensor of claim 3, wherein the standard photo-sensing and charge storage region and the second charge storage region interface with a common charge detection node.

5. The image sensor of claim 4, wherein the array of pixels has an arrangement in the form of a predetermined pattern and includes a group of the pixels with magenta color filters and a group of the pixels with cyan color filters.

6. The image sensor of claim 4, wherein the array of pixels has an arrangement in the form of a predetermined pattern and includes a group of the pixels with color filters and a group of the pixels with no color filters.

7. The image sensor of claim 4, wherein the array of pixels is obtained as each of the pixels includes the potential barrier located at a different depth from the surface portion of the substrate but does not include color filters and are arranged in a predetermined pattern.

8. The image sensor of claim 6, wherein the group of the pixels with the color filers and the group of the pixels with no color filters have different conversion gain factors.

9. The image sensor of claim 7, wherein the pixels including the potential barrier at the different depth have different conversion gain factors.

10. The image sensor of claim 1, wherein the standard photo-sensing and charge storage region is a pinned photo-diode.

11. The image sensor of claim 1, wherein the substrate of the pixel and the potential barrier are doped with a same impurity type.

12. The image sensor of claim 1, wherein the second photo-generated carriers in the undepleted region are stored in the second charge storage region.

13. The image sensor of claim 1, wherein the potential barrier is further configured to divert the second photo-generated carriers so that the second photo-generated carriers are isolated from the depleted region.

14. An image sensor including an array of pixels, each pixel comprising:
    a depleted region under a surface portion of a substrate, wherein the depleted region is configured to collect first photo-generated carriers;
    a second charge storage region formed at the surface portion of the substrate and separated from the depleted region;
    an undepleted region underneath the depleted region, wherein the undepleted region is configured to collect second photo-generated carriers;
    a potential barrier separating the depleted region from the undepleted region, wherein the potential barrier is configured to divert the second photo-generated carriers from the undepleted region to the second charge storage region.

15. The image sensor of claim 1, further comprising a charge cross-talk barrier.

16. The image sensor of claim 15, wherein at least a portion of the charge cross-talk barrier abuts at least a portion of the potential barrier.

17. The image sensor of claim 15, wherein the charge cross-talk barrier is perpendicularly-oriented with respect to the potential barrier.

18. The image sensor of claim 14, further comprising a charge cross-talk barrier.

19. The image sensor of claim 18, wherein at least a portion of the charge cross-talk barrier abuts at least a portion of the potential barrier.

20. The image sensor of claim 18, wherein the charge cross-talk barrier is perpendicularly-oriented with respect to the potential barrier.

21. A method of operating a pixel of an image sensor, the method comprising:
    collecting first photo-generated carriers in a depleted region under a surface portion of a substrate;
    collecting second photo-generated carriers in an undepleted region that is separated from the depleted region by a potential barrier;
    diverting the second photo-generated carriers from the undepleted region to a second charge storage region via the potential barrier; and
    isolating the second photo-generated carriers from the depleted region through said diverting.

22. The method of claim 21, further comprising using a charge cross-talk barrier to minimize lateral charge diffusion and pixel cross talk.

23. The method of claim 22, wherein at least a portion of the charge cross-talk barrier abuts at least a portion of the potential barrier.

24. The method of claim 22, wherein the charge cross-talk barrier is perpendicularly-oriented with respect to the potential barrier.

* * * * *